US009558928B2

(12) United States Patent
Thedjoisworo et al.

(10) Patent No.: US 9,558,928 B2
(45) Date of Patent: Jan. 31, 2017

(54) CONTACT CLEAN IN HIGH-ASPECT RATIO STRUCTURES

(71) Applicant: Lam Research Corporation, Fremont, CA (US)

(72) Inventors: Bayu Thedjoisworo, San Jose, CA (US); Helen Zhu, Fremont, CA (US); Linda Marquez, San Jose, CA (US); Joon Park, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 98 days.

(21) Appl. No.: 14/577,977

(22) Filed: Dec. 19, 2014

(65) Prior Publication Data

US 2016/0064212 A1 Mar. 3, 2016

Related U.S. Application Data

(60) Provisional application No. 62/044,117, filed on Aug. 29, 2014.

(51) Int. Cl.
H01L 21/02 (2006.01)
H01J 37/32 (2006.01)

(52) U.S. Cl.
CPC ..... H01L 21/02063 (2013.01); H01J 37/3244 (2013.01); H01J 37/32357 (2013.01); H01J 37/32862 (2013.01)

(58) Field of Classification Search
None
See application file for complete search history.

(56) References Cited

U.S. PATENT DOCUMENTS 7,767,024 B2 8/2010 Kao et al.
8,679,982 B2 * 3/2014 Wang ............... H01J 37/32357
216/37

(Continued)

FOREIGN PATENT DOCUMENTS

EP 0 658 928 6/1995

OTHER PUBLICATIONS

U.S. Appl. No. 14/547,974, titled "Polysilicon Etch With High Selectivity," Thedjoisworo et al., filed Nov. 19, 2014.

(Continued)

Primary Examiner — Allan Olsen
(74) Attorney, Agent, or Firm — Weaver Austin Villeneuve & Sampson LLP

(57) ABSTRACT

Method and apparatus for cleaning a substrate having a plurality of high-aspect ratio openings are disclosed. A substrate can be provided in a plasma processing chamber, where the substrate includes the plurality of high-aspect ratio openings, the plurality of high-aspect ratio openings are defined by vertical structures having alternating layers of oxide and nitride or alternating layers of oxide and polysilicon. The substrate can include a silicon oxide layer over a damaged or amorphous silicon layer in the high-aspect ratio openings. To remove the silicon oxide layer, a bias power can be applied in the plasma processing chamber at a low pressure, and a fluorine-based species can be used to etch the silicon oxide layer. To remove the underlying damaged or amorphous silicon layer, a source power and a bias power can be applied in the plasma processing chamber, and a hydrogen-based species can be used to etch the damaged or amorphous silicon layer.

20 Claims, 12 Drawing Sheets

(56) References Cited

U.S. PATENT DOCUMENTS

| | | | |
|---|---|---|---|
| 8,679,983 B2* | 3/2014 | Wang | H01L 21/3065 216/58 |
| 8,916,477 B2 | 12/2014 | Thedjoisworo et al. | |
| 8,969,212 B2* | 3/2015 | Ren | H01L 21/31116 216/37 |
| 9,034,773 B2 | 5/2015 | Thedjoisworo et al. | |
| 9,330,926 B2* | 5/2016 | Chebi | H01L 21/3065 |
| 2002/0045355 A1 | 4/2002 | Chong et al. | |
| 2002/0132422 A1* | 9/2002 | Ranade | H01L 21/3065 438/243 |
| 2002/0185469 A1 | 12/2002 | Podlesnik et al. | |
| 2009/0184089 A1* | 7/2009 | Chebi | H01J 37/3244 216/13 |
| 2009/0191714 A1 | 7/2009 | Lai et al. | |
| 2009/0246965 A1 | 10/2009 | Mori et al. | |
| 2011/0294300 A1 | 12/2011 | Zhang et al. | |
| 2013/0089988 A1* | 4/2013 | Wang | H01J 37/32357 438/719 |
| 2014/0004707 A1 | 1/2014 | Thedjoisworo et al. | |
| 2014/0004708 A1 | 1/2014 | Thedjoisworo et al. | |
| 2014/0054269 A1* | 2/2014 | Hudson | H01J 37/32091 216/67 |
| 2015/0064919 A1* | 3/2015 | Kim | H01L 21/3065 438/712 |
| 2015/0075715 A1 | 3/2015 | Thedjoisworo et al. | |
| 2016/0064519 A1 | 3/2016 | Yang et al. | |

OTHER PUBLICATIONS

U.S. Office Action, dated May 7, 2014, issued in U.S. Appl. No. 13/916,387.
U.S. Notice of Allowance, dated Sep. 11, 2014, issued in U.S. Appl. No. 13/916,387.
U.S. Office Action, dated May 30, 2014, issued in U.S. Appl. No. 13/916,497.
U.S. Final Office Action, dated Nov. 6, 2014, issued in U.S. Appl. No. 13/916,497.
Nishino, et al., (Jul. 15, 1993) "Damage-Free Selective Etching of Si Native Oxides Using NH3/NF3 and SF6/H2O Down-Flow Etching," *J. Appl. Phys.*, 74(3):1345-1348.
Sidhwa, et al., (Jul./Aug. 1993) "Reactive Ion Etching of Crystalline Silicon Using NF3 Diluted with H2," *J. Vac. Sci. Technol. A.*, 11(4):1156-1160.
Wolf, Stanley, Ph.D., (2002) "Silicon Processing for the VLSI Era," *Lattice Press, Sunset Beach*, 4:Chapter 3, p. 75.
U.S. Notice of Allowance, dated Feb. 13, 2015, issued in U.S. Appl. No. 13/916,497.

* cited by examiner

CONTACT CLEAN IN HIGH-ASPECT RATIO STRUCTURES

CROSS-REFERENCE TO RELATED APPLICATIONS

This application claims the benefit of priority to U.S. Provisional Application No. 62/044,117, titled "CONTACT CLEAN IN HIGH-ASPECT RATIO STRUCTURES," filed Aug. 29, 2014, which is incorporated herein by reference in its entirety and for all purposes.

INTRODUCTION

Field of the Invention

The present disclosure relates generally to cleaning contacts and slits in high-aspect ratio openings of a substrate, and more specifically to dry etching of oxidized layers, silicon oxide, damaged silicon, and other contaminants in the high-aspect ratio openings defined by structures having alternating layers of oxide and nitride or oxide and polysilicon.

BACKGROUND

Plasma-based etching can be an important processing step in the fabrication of semiconductor devices and integrated circuits. However, the plasma-based etching can result in contaminants, including oxides and damaged or amorphous silicon. The presence of oxides and damaged silicon on the surfaces of materials, including semiconductor substrates containing silicon and metals, can adversely affect subsequent fabrication processes, thereby affecting the performance of the semiconductor device. In particular, when oxides and other contaminants are formed on silicon, the oxides or other contaminants can be electrically insulating and can be detrimental to electrical pathways of contacts in the semiconductor device or integrated circuit.

Memory devices, such as 3-dimensional vertical NAND (V-NAND) memory devices, may include vertical structures having alternating layers of oxide and nitride (ONON) on a silicon substrate. In some implementations, devices may have alternating layers of oxide and polysilicon (OPOP). High-aspect ratio openings may be formed between each of the vertical structures. The high-aspect ratio openings may subsequently serve as electrical contacts in the memory device. As used herein, high-aspect ratio openings may also be referred to as high-aspect ratio contacts. In some implementations, the high-aspect ratio openings can take the shape of a hole, slit, or a trench. The high-aspect ratio openings may be formed using a plasma-based etch. The plasma-based etch may use a significant concentration of oxygen and high ionization energies, which can result in the formation of oxides (e.g., silicon oxide), damaged silicon, and other contaminants (e.g., carbon) at the bottom of the high-aspect ratio openings. The openings may be filled or substantially filled with metal to create an electrical contact in the memory device. However, upon forming electrical contacts in the high-aspect ratio openings, the presence of the undesired oxides, damaged silicon, and other contaminants can be detrimental to the performance of the memory device.

SUMMARY

This disclosure pertains to methods of cleaning a substrate having a plurality of high-aspect ratio openings. The method includes providing a substrate having a plurality of high-aspect ratio openings into a plasma processing chamber, where each of the openings have a height to lateral dimension aspect ratio of greater than about 10:1. The method further includes flowing a first etchant including a fluorine-based species towards the substrate, and applying a first bias power to the plasma processing chamber to generate a plasma of the fluorine-based species to remove silicon oxide in the high-aspect ratio openings. The method further includes flowing a second etchant including a hydrogen-based species towards the substrate, and applying a source power and a second bias power to the plasma processing chamber to generate a plasma of the hydrogen-based species to remove silicon in the high-aspect ratio openings.

In some implementations, the second etchant includes only hydrogen. In some implementations, the second etchant includes hydrogen and nitrogen trifluoride, where a concentration of hydrogen is greater than a concentration of nitrogen trifluoride. In some implementations, the first etchant includes only nitrogen trifluoride. In some implementations, the substrate includes a plurality of vertical structures defining each of the high-aspect ratio openings, each of the vertical structures including alternating layers of oxide and nitride. In some implementations, the ratio between the source power and the second bias power to remove silicon is about equal to or greater than about 2:1.

This disclosure also pertains to an apparatus for cleaning a substrate having a plurality of high-aspect ratio openings. The apparatus includes a plasma processing chamber that includes a remote plasma source and a substrate support for supporting a substrate having a plurality of high-aspect ratio openings, each of the openings having a height to lateral dimension aspect ratio of greater than about 10:1, and the substrate having a silicon oxide layer over a silicon layer in the high-aspect ratio openings. The apparatus further includes a controller configured to provide instructions for performing the following operations: (a) flowing a first etchant including a fluorine-based species towards the substrate; (b) applying a first bias power to the substrate support in the plasma processing chamber to generate a plasma of the fluorine-based species to remove the silicon oxide layer; (c) flowing a second etchant including a hydrogen-based species towards the substrate; and (d) applying a source power to the remote plasma source and a second bias power to the substrate support in the plasma processing chamber to generate a plasma of the hydrogen-based species to remove the silicon layer.

In some implementations, the second etchant includes only hydrogen. In some implementations, the second etchant includes hydrogen and nitrogen trifluoride, where a concentration of hydrogen is greater than a concentration of nitrogen trifluoride. In some implementations, the first etchant includes only nitrogen trifluoride. In some implementations, the substrate includes a plurality of vertical structures defining each of the high-aspect ratio openings, each of the vertical structures including alternating layers of oxide and nitride. In some implementations, a ratio between the source power and the second bias power to remove the silicon layer is about equal to or greater than about 2:1.

This disclosure also pertains to a method of cleaning a substrate having a plurality of high-aspect ratio openings. The method includes providing a substrate having a plurality of high-aspect ratio openings into a plasma processing chamber, where each of the openings have a height to lateral dimension aspect ratio of greater than about 10:1. The method further includes flowing a first etchant including a fluorine-based species or hydrogen-based species towards the substrate, and applying a first bias power to the plasma processing chamber to generate a plasma of the first etchant to remove silicon oxide in the high-aspect ratio openings. The method further includes flowing a second etchant including a hydrogen-based species towards the substrate, and applying a source power and a second bias power to the plasma processing chamber to generate a plasma of the second etchant to remove silicon in the high-aspect ratio openings. In some implementations, the first etchant includes the hydrogen-based species, and the removed silicon oxide includes removed native silicon oxide.

DETAILED DESCRIPTION

Introduction

Figure 1:
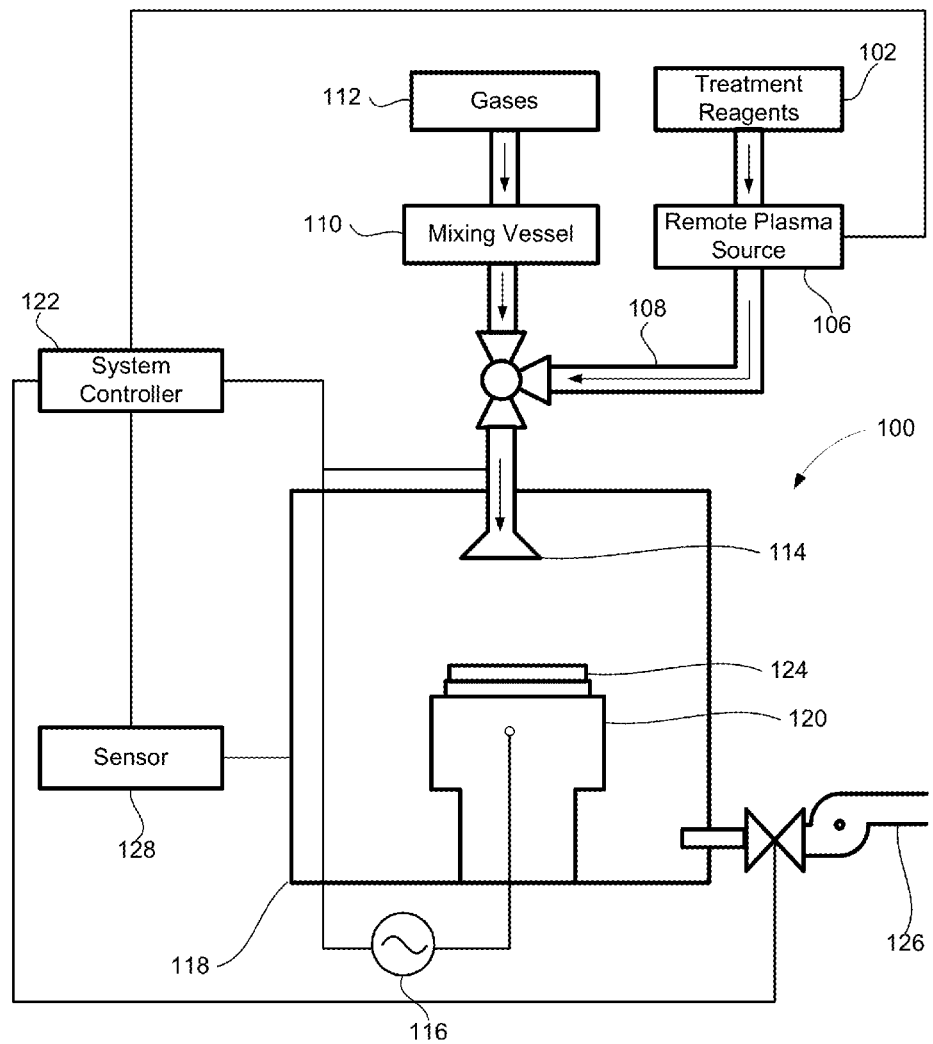
FIG. 1 shows a schematic of an example of an apparatus including a plasma processing chamber equipped to provide source power and bias power according to some implementations.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Conventional methods of cleaning high-aspect ratio contacts can be highly complicated and costly. One such conventional method can involve a wet-etch process. However, the use of a wet etchant for removing oxides at contact bottom may be expensive, may pose serious safety concerns, may not achieve a high selectivity over other materials, may cause additional exposure to ambient conditions to allow native oxides to regrow, and may be problematic for devices involving high-aspect ratio features.

For example, the wet approach for devices with high-aspect ratio features can involve a series of wet-etch processes. High-aspect ratio features can include high-aspect ratio contacts with oxides and damaged silicon formed at a contact bottom, with the high-aspect ratio contacts between vertical structures of ONON stacks. Oxides at a contact bottom can be first removed using dilute HF solution, followed by another wet-etch step that removes the damaged silicon. However, due to the lack of directionality of wet-etch processes, the dilute HF exposure naturally damages the oxide sidewall of the ONON stack by laterally recessing into the oxide layer. This step is problematic, as it creates "waviness" along the sidewalls of the ONON stack. Because of this waviness, the substrate may be subjected to another wet-etch step that laterally recesses the nitride layers of the ONON stack in an attempt to straighten the ONON sidewalls. The oxide- and nitride-trimming steps may have to be repeated multiple times in order to completely straighten the ONON sidewalls. The series of wet-etch steps may be complicated, time-consuming, and costly.

An alternative to the wet-etch process can be a dry-etch process. A dry-etch process can include a plasma-based approach to remove the oxides and to remove the damaged/amorphous silicon at the contact bottom. A plasma-based approach can use a fluorine-based etchant, such as nitrogen trifluoride ($NF_3$), a mixture of ammonia and nitrogen trifluoride ($NH_3/NF_3$), or a mixture of hydrogen and nitrogen trifluoride ($H_2/NF_3$). However, the dry-etch process may face different challenges, some of which are described below.

The high-aspect ratio nature of the contact can pose transport resistance issues for an active species generated in the plasma to reach the contact bottom. Depending on the size of the active species, the concentration of the active species may be more depleted approaching the contact bottom. As a result, the removal efficiency of the oxide, the damaged/amorphous silicon, and other contaminants at the contact bottom may be more depressed, and removing them completely from the contact bottom may be highly challenging.

A plasma-based approach may use a fluorine-based etchant to remove the oxides and damaged/amorphous silicon at the bottom of the high-aspect ratio openings. Typically, a fluorine-based etchant is effective in removing silicon oxides. However, due to lack of selectivity of the fluorine-based etchant, it may readily react with the silicon oxide and the silicon nitride layers in the ONON stack. This means that the fluorine-based etchant creates a high risk of damaging the ONON sidewalls as the silicon oxide is being removed at the contact bottom. The fluorine-based etchant can attack the silicon oxide layers and the silicon nitride layers in the ONON stack at differing etch rates, resulting in waviness along the ONON sidewalls. In addition, a concentration of a fluorine-based etchant may decrease as it traverses further down the high-aspect ratio opening. This means that the fluorine-based etchant is depleted faster near the top of the opening than at the bottom of the opening, meaning that the amount of lateral recess into the oxide and the nitride layers would decrease as a function of depth into the high-aspect ratio opening. This phenomenon creates a taper in the ONON sidewalls, which is undesirable. Furthermore, the low concentration of fluorine-based etchant at the bottom of the opening means that the process must run for a relatively long period of time to clean the contact bottom. The longer time can further increase the likelihood of damaging the ONON sidewalls. Currently available dry etchants can rely on certain chemistries ($NH_3/NF_3$ and $H_2/NF_3$) and the associated conditions that generate a salt byproduct of ammonium hexafluorosilicate $(NH_4)_2SiF_6$ in order to remove the oxide at the contact bottom. If the byproduct is not removed entirely, however, then the residue left behind in and around the high-aspect ratio contact can compromise the device performance.

The Solution

The present disclosure describes a method of cleaning high-aspect ratio contacts. The method includes an oxide breakthrough step and a damaged/amorphous silicon removal step. The oxide breakthrough step may use plasma of a fluorine-based species, such as $NF_3$ plasma, where the plasma is generated using bias power only. In some implementations, where the oxide breakthrough step includes removal of native silicon oxides, the plasma may include a pure $H_2$ plasma. In some implementations, the plasma is under low pressure conditions. The bias power and the low pressure provide directionality to the plasma so that sidewalls in the high-aspect ratio contacts are not damaged. The damaged/amorphous silicon removal step uses plasma of a hydrogen-based species, such as a pure $H_2$ plasma or a $H_2/NF_3$ plasma, where the plasma is generated using both source power and bias power. The pure $H_2$ plasma or the $H_2/NF_3$ plasma is highly selective over exposed nitride and oxide materials so that any damage to sidewalls with exposed nitride and oxide is negligible. In some implementations, the plasma may be selective over exposed oxide and polysilicon materials. Neither the highly directional oxide breakthrough step using $NF_3$ nor the highly selective silicon removal step using $H_2$ or $H_2/NF_3$ generates undesirable salt byproducts.

Apparatus

An apparatus for performing the aforementioned contact cleaning can include a plasma processing chamber. A substrate, such as a semiconductor wafer, can be positioned on a pedestal in the plasma processing chamber. The pedestal in some implementations can be an Electro Static Chuck (ESC). A showerhead for delivering gases into the plasma processing chamber is positioned over the pedestal or ESC, where the gases may be used to treat the substrate. The gases may be exposed to one or more plasma sources to generate plasma for treating the substrate. The plasma processing chamber may be connected to a source power and a bias power for generating plasma to be delivered to the substrate.

FIG. 1 shows a schematic of an example of an apparatus including a plasma processing chamber connected to a source power and a bias power according to some implementations. The apparatus 100 includes a processing chamber 118, a system controller 122, and a remote plasma source 106. The processing chamber 118 includes a pedestal 120 for supporting a substrate 124, a showerhead 114, and other components described below. In the example illustrated in FIG. 1, the apparatus 100 further includes a RF power supply 116.

Treatment gases 102, such as hydrogen ($H_2$) and nitrogen trifluoride ($NF_3$), may be supplied to the remote plasma source 106. Other gases can include but is not limited to helium (He), argon (Ar), nitrogen ($N_2$), carbon tetrafluoride ($CF_4$), and ammonia ($NH_3$). The treatment gases 102 may be supplied from a storage tank containing one or more mixture of reagents. The treatment gases 102 may be flowed through a connecting line 108 into the processing chamber 118, where the treatment gases 102 are distributed through the showerhead 114 to treat the substrate 124 on the pedestal 120. The treatment gases 102 may be exposed to the remote plasma source 106 to generate plasma, including radicals, ions, and other active species of the treatment gases 102. The radicals, ions, and other active species of the treatment gases 102 may be distributed through the showerhead 114 to treat the substrate 124 on the pedestal 120.

Other process gases or carrier gases 112 may be supplied to a mixing vessel 110. The mixing vessel 110 may provide blending and condition process gases or carrier gases 112 for delivery to the showerhead 114. One or more valves may control the introduction of process gases or carrier gases 112 to the mixing vessel 110. The showerhead 114 distributes the process gases or carrier gases 112 to toward the substrate 124. It will be appreciated that showerhead 114 may have any suitable shape, and may have any suitable number and arrangement of ports for distributing process gases or carrier gases 112 to the substrate 124. In certain embodiments, the showerhead 114 is configured to deliver two or more gases at different temperatures. Examples of such showerheads are further discussed in U.S. patent application Ser. No. 13/934, 597, filed Jul. 3, 2013, and titled "MULTI-PLENUM, DUAL-TEMPERATURE SHOWERHEAD," which is herein incorporated by reference in its entirety.

The processing chamber 118 may be connected to or include sensors 128 for sensing various materials and their representative concentrations, pressure, temperature, and other process parameters and providing information on conditions during the process to the system controller 122. Examples of chamber sensors that may be monitored during the process include mass flow controllers, pressure sensors such as manometers, and thermocouples located in the pedestal 120. Sensors 128 may also include an infra-red detector or optical detector to monitor the presence of gases in the processing chamber 118. Volatile byproducts and other excess gases can be removed from the processing chamber 118 via an outlet 126 that may include a vacuum pump and a valve.

In some implementations, the pedestal 120 may be raised or lowered for positioning the substrate 124 to be further or closer to the showerhead 114. Pedestal 120 may be mechanically or fluidly coupled to a rotation unit and/or an elevator unit to provide rotational and/or height adjustment with respect to showerhead 114. In some implementations, the pedestal 120 may be actively cooled or actively heated to control the temperature of the substrate 124. In one example, the temperature of the pedestal 120 may be controlled by a heater. In another example, the temperature of the pedestal 120 may be controlled by heat transfer fluid circulating through fluid channels in the pedestal 120.

Plasmas may be generated by applying an RF field to a gas or a gas mixture using two capacitively coupled plates. In some implementations, the pedestal 120 can serve as one of the electrodes. The gas may be process gases 112 supplied through the showerhead 114. Ionization of the gas between the plates by the RF field ignites a plasma, creating free electrons in a plasma discharge region between the two capacitively coupled plates. These electrons may be accelerated by the RF field and collide with gas-phase reactant molecules. Collision of these electrons with reactant molecules may form active species that participate in substrate processing. In some implementations, the plasma discharge region may be formed directly above the surface of the substrate 124. The showerhead 114 may be in electrical communication with the RF power supply 116 and may couple with the pedestal 120 to form the plasma discharge region.

As illustrated in the example in FIG. 1, the showerhead 114 and the pedestal 120 electrically communicate with RF power supply 116 and matching network for powering a plasma. The plasma may be an in-situ plasma between the showerhead 114 and the pedestal 120. In some implementations, plasma energy may be controlled by controlling one or more of a chamber pressure, a gas concentration, an RF bias power, an RF bias frequency, and a plasma power pulse timing. For example, the RF power supply 116 and matching network may be operated at any suitable power to form a plasma having a desired composition of active species. RF power supply 116 may provide RF power of any suitable frequency. In some embodiments, RF power supply 116 may be configured to control high- and low-frequency RF power sources independently of one another. Example low-frequency RF frequencies include, but are not limited to, frequencies between 50 kHz and 500 kHz. Example high-frequency RF frequencies include, but are not limited to, frequencies between 1.8 MHz and 2.45 GHz. It will be appreciated that any suitable parameters may be modulated discretely or continuously to provide plasma energy for reactions at the surface of the substrate 124. The plasma power may be controlled to increase or decrease the ion bombardment with the surface of the substrate 124.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

The apparatus 100 can include a system controller or controller 122 for controlling various process conditions. The controller 122 will typically include one or more memory devices and one or more processors. The processor may include a CPU or computer, analog and/or digital input/output connections, stepper motor controller boards, etc. Typically there will be a user interface associated with controller 122. The user interface may include a display screen, graphical software displays of the apparatus and/or process conditions, and user input devices such as pointing devices, keyboards, touch screens, microphones, etc.

In some implementations, a controller 122 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 122, depending on the processing requirements and/or the type of system, may be programmed to control any of the processes disclosed herein, including the delivery of gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 122 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 122 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 122, in some implementations, may be a part of or coupled to a computer that is integrated with, coupled to the system, otherwise networked to the system, or a combination thereof. For example, the controller 122 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 122 receives instructions in the form of data, which specify parameters for each of the processing steps to be performed during one or more operations. It should be understood that the parameters may be specific to the type of process to be performed and the type of tool that the controller 122 is configured to interface with or control. Thus as described above, the controller 122 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 122 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 122 may be configured to control the bias power and the source power for generation of the plasma in the plasma processing chamber 118. The apparatus 100 may provide active species to the plasma processing chamber 118 by applying a bias power using the RF power supply 116 and matching network to generate an in-situ plasma over the surface of the substrate 124. The apparatus may also provide active species to the plasma processing chamber 118 by applying at least a source power using the remote plasma source 106 to generate a remote plasma. In some implementations, source power may be applied in conjunction with bias power for generation of the plasma used for contact cleaning. Treatment gases 102 may be exposed to the remote plasma source 106 to produce radicals of the treatment gases 102. The plasma may further include ions and other active species. The radicals, ions, and other active species may be carried in the gas phase towards the substrate 124 through the showerhead 114. Coils (not shown) may surround the walls of the remote plasma source 106 and generate the remote plasma in the remote plasma source 106. In some implementations, the coils may be in electrical communication with a RF power source or a microwave power source. Examples of remote plasma sources 106 can include the Gamma® 2100, 2130 I2CP (Interlaced Inductively Coupled Plasma), G400, GxT, and the SIERRA, offered by Lam Research Corporation of Fremont, Calif. Another example can be found in the Astron®, manufactured by MKS Instruments of Wilmington, Mass.

Figure 2:
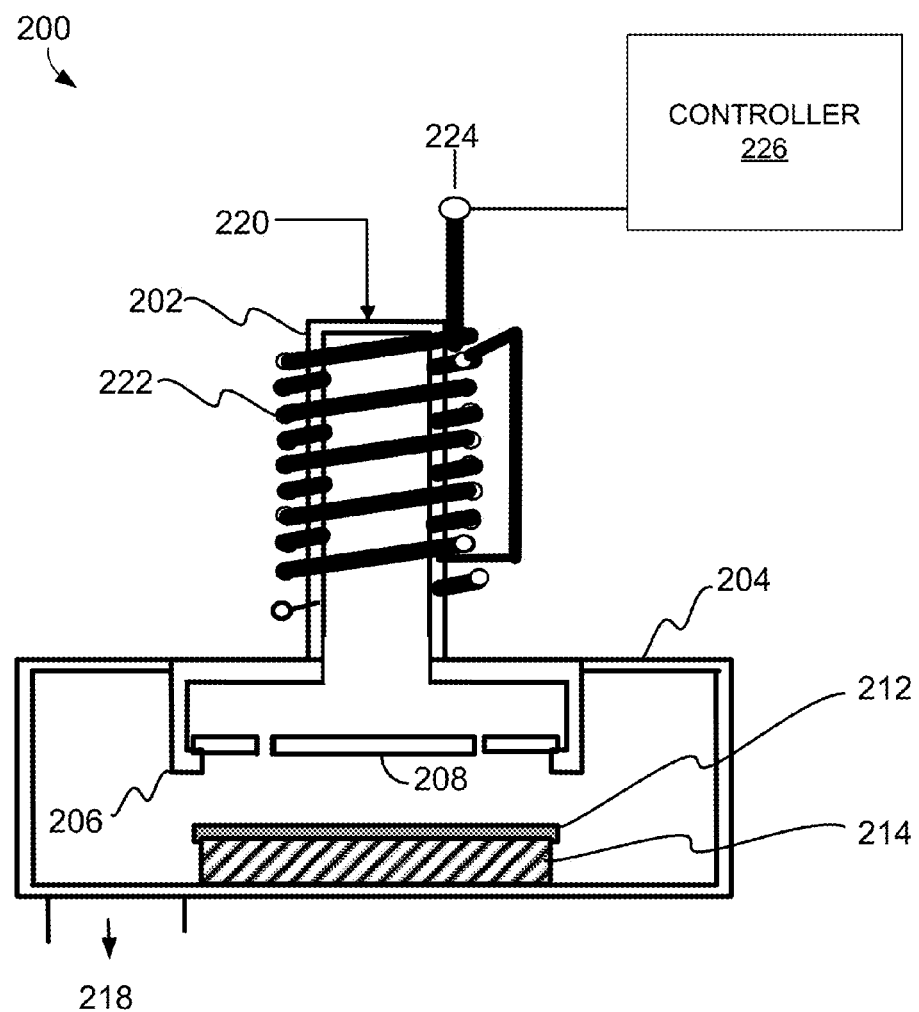
FIG. 2 shows a schematic of an example of a downstream plasma device according to some implementations.

In some implementations, the remote plasma source 106 in FIG. 1 may be part of a downstream plasma device. FIG. 2 shows a schematic of an example of a downstream plasma device according to some implementations. The downstream plasma device 200 has a plasma source chamber 202 and an exposure chamber 204 separated by a showerhead assembly 206. The showerhead assembly 206 includes a showerhead 208. Inside the exposure chamber 204, a substrate 212 rests on a platen, pedestal, stage, ESC, or substrate support 214. In some implementations, the surface of the showerhead 208 facing the substrate support 214 is about 0.1 to 2.0 inches from the surface of a substrate 212 on the substrate support 214. The thickness of the substrate 212 is generally less than about 1 mm, so the distance between the surface of the showerhead 208 and the surface of a substrate 212 can generally be considered the distance between the surface of the showerhead 208 and the substrate support 214 when the substrate 212 rests directly on the substrate support 214. In cases where the substrate 212 rests on a support structure (e.g., lift pins or a gas flow blanket) on the substrate support 214, the distance between the surface of the showerhead 208 and the surface of a substrate 212 can generally be considered the distance between the surface of the showerhead 208 and the support structure.

In some implementations, an RF power supply can be configured to apply RF power to the substrate support 214 to provide a bias source. The RF power supply can be a low frequency power source in some implementations, and the RF power supply can be a high frequency power source in some implementations. In further implementations, the RF power supply includes both a low frequency and a high frequency power source.

In some implementations, low pressure may be attained in the exposure chamber 204 via a vacuum pump (not shown) via a conduit 218. The pressure in the exposure chamber 204 can be about 200 milli-torr (mTorr) to about 3500 mTorr in some implementations, and about 5 mTorr to over 200 mTorr in further implementations.

Gas sources provide a flow of gas via an inlet 220 into the plasma source chamber 202 of the downstream plasma device 200. The plasma source chamber 202 is surrounded in part by induction coils 222, which are in turn connected to a power source 224. Various configurations and geometries of the plasma source chamber 202 and the induction coils 222 may be used. For example, the induction coils 222 may loop around the plasma source chamber 202 in an interlaced pattern. In another example, the plasma source chamber 202 may be shaped as a dome instead of a cylinder. A controller 226, such as a system controller described earlier herein, may be connected to the power source 224. The controller 226 may be connected to other components of the downstream plasma device 200 to control, for example, the gas composition, the pressure, and the temperature of the substrate support 214. Machine-readable media may be coupled to the controller 226 and contain instructions for controlling process conditions for the operations in the downstream plasma device 200.

Various types of plasma sources may be used in accordance with the present disclosure, including RF, DC, and microwave-based plasma sources. In some implementations, a downstream RF plasma source is used. Typically, the RF plasma power for a 300 mm substrate can range between about 300 W to about 10 kW. In some implementations, the RF plasma power is between about 2000 W and about 5000 W, such as about 3500 W.

In some implementations, the plasma source chamber 202 can be a dome made of various materials, including quartz, ceramic, or aluminum nitride (AlN) material. Etching materials such as polysilicon in a quartz dome may lead to the formation of silicon oxide. However, etching polysilicon in a ceramic dome can minimize the formation silicon oxide. The dome surface can also be coated with films such as yttrium oxide or yttrium fluoride in order to reduce or otherwise prevent the degradation of dome material.

During operation, gas mixtures are introduced into the plasma source chamber 202 and the induction coils 222 are energized with the power source 224 to generate a plasma. In other words, the induction coils 222 generate an inductively coupled plasma in the plasma source chamber 202. The gas mixtures introduced into the plasma source chamber 202 contain chemically active species that will be ionized and radicalized to form the plasma. The showerhead 208 includes a plurality of holes or passageways through which plasma species from the plasma may pass and enter the exposure chamber 204. The showerhead 208, with a voltage applied to it, in some embodiments, terminates the flow of ions from the plasma and allows the flow of radicals and other neutral species from the plasma into the exposure chamber 204. The showerhead 208 may be grounded or have an applied voltage to attract some active species while not affecting the flow of neutral species to the wafer, e.g., 0-1000 Watt bias. Many of the electrically active species in the plasma recombine at the showerhead 208. As described earlier herein, the substrate support 214 may have a bias applied to it. The showerhead 208 may be a metal plate having holes to direct the plasma and inert gas mixture into the exposure chamber 204. The number and arrangement of the showerhead holes may be set to optimize the etching operation. The plasma species that enter the exposure chamber 204 may remove material from the substrate 212.

Other examples of remote plasma sources can be described in U.S. Pat. No. 8,084,339, titled "REMOTE PLASMA PROCESSING OF INTERFACE SURFACES," issued Dec. 27, 2011, and U.S. Pat. No. 8,864,935, titled "PLASMA GENERATOR APPARATUS," issued Oct. 21, 2014, all of which are incorporated herein by reference in their entirety and for all purposes.

The apparatus 100 in FIG. 1 may or may not include the downstream plasma device 200 as described in FIG. 2. In some implementations, the apparatus 100 in FIG. 1 is depicted as a standalone processing apparatus having a plasma processing chamber 118. However, it will be appreciated that a plurality of processing chambers or stations may be included in a common process tool environment, such as a multi-station processing tool. Further, it will be appreciated that, in some implementations, one or more hardware parameters of the apparatus 100, including those discussed in detail above, may be adjusted programmatically by one or more computer controllers.

Figure 3:
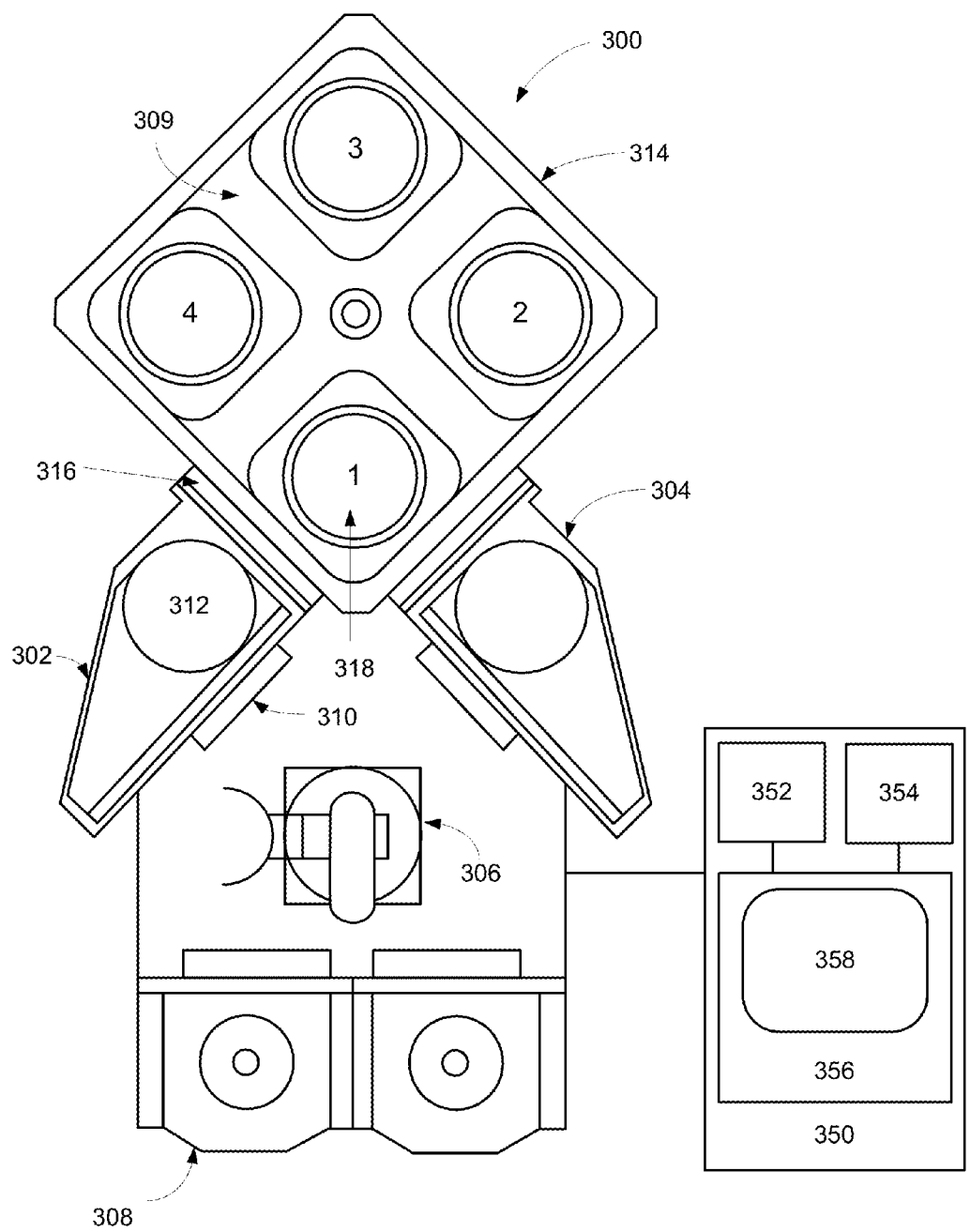
FIG. 3 shows a schematic of an example of a multi-station processing tool according to some implementations.

FIG. 3 shows a schematic of an example of a multi-station processing tool according to some implementations. The multi-station processing tool 300 can include an inbound load lock 302 and an outbound load lock 304, either or both of which may comprise a remote plasma source. A robot 306, at atmospheric pressure, is configured to move wafers from a cassette loaded through a pod 308 into inbound load lock 302 via an atmospheric port 310. A wafer is placed by the robot 306 on a pedestal 312 in the inbound load lock 302, the atmospheric port 310 is closed, and the load lock is pumped down. Where the inbound load lock 302 comprises a remote plasma source, the wafer may be exposed to a remote plasma treatment in the load lock prior to being introduced into a processing chamber 314. Further, the wafer also may be heated in the inbound load lock 302 as well, for example, to remove moisture and adsorbed gases. Next, a chamber transport port 316 to processing chamber 314 is opened, and another robot (not shown) places the wafer into the reactor on a pedestal of a first station shown in the reactor for processing. While the embodiment depicted in FIG. 3 includes load locks, it will be appreciated that, in some embodiments, direct entry of a wafer into a process station may be provided.

The depicted processing chamber 314 comprises four process stations, numbered from 1 to 4 in the embodiment shown in FIG. 3. Each station has a heated pedestal (shown at 318 for station 1), and gas line inlets. It will be appreciated that in some embodiments, each process station may have different or multiple purposes. While the depicted processing chamber 314 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 3 depicts an embodiment of a wafer handling system 390 for transferring wafers within processing chamber 314. In some embodiments, wafer handling system 390 may transfer wafers between various process stations and/or between a process station and a load lock. It will be appreciated that any suitable wafer handling system may be employed. Non-limiting examples include wafer carousels and wafer handling robots. FIG. 3 also depicts an implementation of a system controller 350 employed to control process conditions and hardware states of process tool 300. System controller 350 may include one or more memory devices 356, one or more mass storage devices 354, and one or more processors 352. Processor 352 may include a CPU or computer, analog, and/or digital input/output connections, stepper motor controller boards, etc.

In some implementations, system controller 350 controls all of the activities of process tool 300. System controller 350 executes system control software 358 stored in mass storage device 354, loaded into memory device 356, and executed on processor 352. Alternatively, the control logic may be hard coded in the controller 350. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 358 may include instructions for controlling the timing, mixture of gases, amount of sub-saturated gas flow, chamber and/or station pressure, chamber and/or station temperature, wafer temperature, target power levels, RF power levels, substrate pedestal, chuck and/or susceptor position, and other parameters of a particular process performed by process tool 300. System control software 358 may be configured in any suitable way. For example, various process tool component subroutines or control objects may be written to control operation of the process tool components necessary to carry out various process tool processes. System control software 358 may be coded in any suitable computer readable programming language.

In some implementations, system control software 358 may include input/output control (IOC) sequencing instructions for controlling the various parameters described above. Other computer software and/or programs stored on mass storage device 354 and/or memory device 356 associated with system controller 350 may be employed in some implementations. Examples of programs or sections of programs for this purpose include a substrate positioning program, a process gas control program, a pressure control program, a heater control program, and a plasma control program.

Device Structure

Figure 4A:
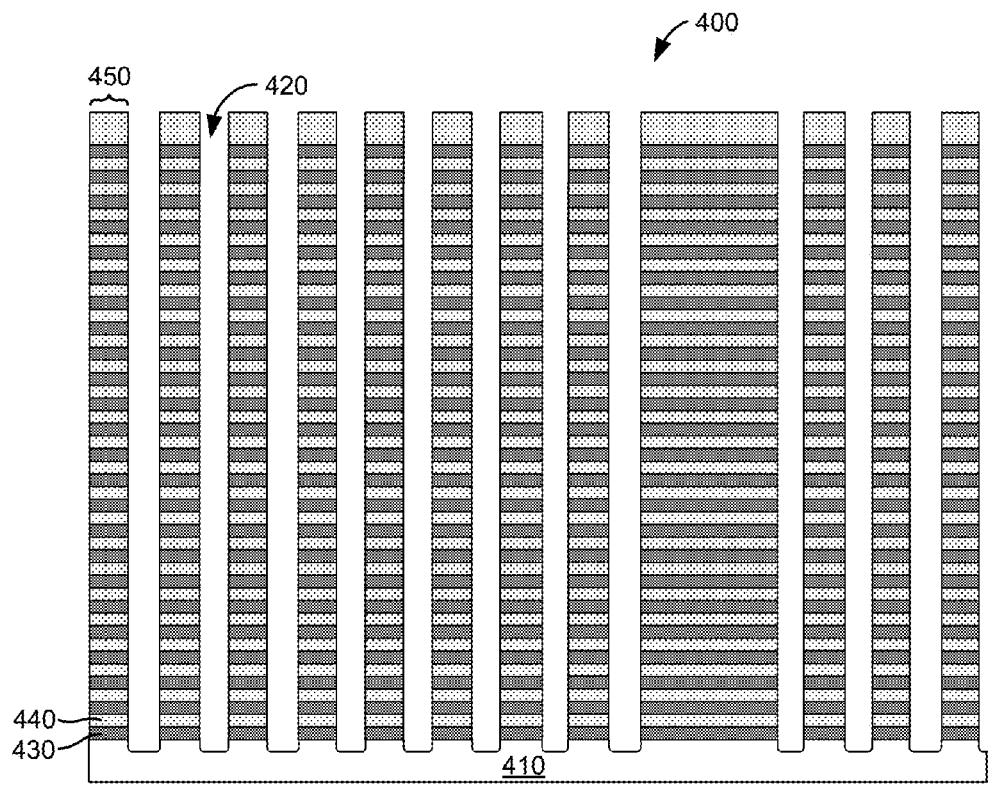
FIG. 4A shows a cross-sectional schematic of an example of a device structure having a plurality of high-aspect ratio openings defined by a plurality of vertical structures.

FIG. 4A shows a cross-sectional schematic of an example of a device structure having a plurality of high-aspect ratio openings defined by a plurality of vertical structures. A device structure 400 can include a substrate 410 such as a silicon substrate. The device structure 400 can include a plurality of high-aspect ratio features. An aspect ratio can be a ratio defined in terms of a vertical dimension relative to a lateral dimension. High-aspect ratio features can include any features having a height to diameter aspect ratio of about 10:1 or greater, or about 40:1 or greater. As illustrated in the example in FIG. 4A, a plurality of vertical structures 450 can be disposed on the substrate 410. The vertical structures 450 can each include alternating layers of oxide 430 and nitride or polysilicon 440. Thus, multiple layers of oxide 430 may be alternatingly disposed between multiple layers of nitride 440, where the layers of oxide 430 can include silicon oxide and the layers of nitride 440 can include silicon nitride. Or, multiple layers of oxide 430 may be alternatingly disposed between multiple layers of polysilicon 440. In some implementations, the thickness of the layer of oxide 430 and the layer of nitride or polysilicon 440 can be between about 10 nm and about 100 nm. The vertical structures 450 can define a plurality of high-aspect ratio openings 420 between the vertical structures 450, where the openings 420 can take the shape of a hole or a trench (e.g., slit). The high-aspect ratio openings 420 can provide electrical contacts in the device structure 400. The high-aspect ratio nature of the electrical contacts, which can extend to 10:1 and beyond 40:1, may present challenges in cleaning the contact bottom. In some implementations, the device structure 400 can be part of a memory device, such as a 3D V-NAND memory device.

The device structure 400 as illustrated in FIG. 4A may be formed by depositing alternating layers of oxide 430 and nitride or polysilicon 440 over a substrate 410. High-aspect ratio openings 420 may be formed in the alternating layers of oxide 430 and nitride or polysilicon 440 by etching. The etch step can be a plasma etch that utilizes high ionization energies and a chemistry that includes oxygen. The plasma etch may terminate upon reaching the substrate 410. However, the plasma etch may generate a layer of silicon oxide and damaged/amorphous silicon at the bottom of the high-aspect ratio openings 420 and over the surface of the silicon substrate 410. Once the high-aspect ratio openings 420 are formed by the plasma etch, the high-aspect ratio openings 420 may each be surrounded by vertical structures 450 having alternating layers of oxide 430 and nitride or polysilicon 440. In some implementations, the alternating layers of oxide 430 and nitride or polysilicon 440 may form an ONON or OPOP stack for a memory device, such as a 3D V-NAND memory device.

Figure 4B:
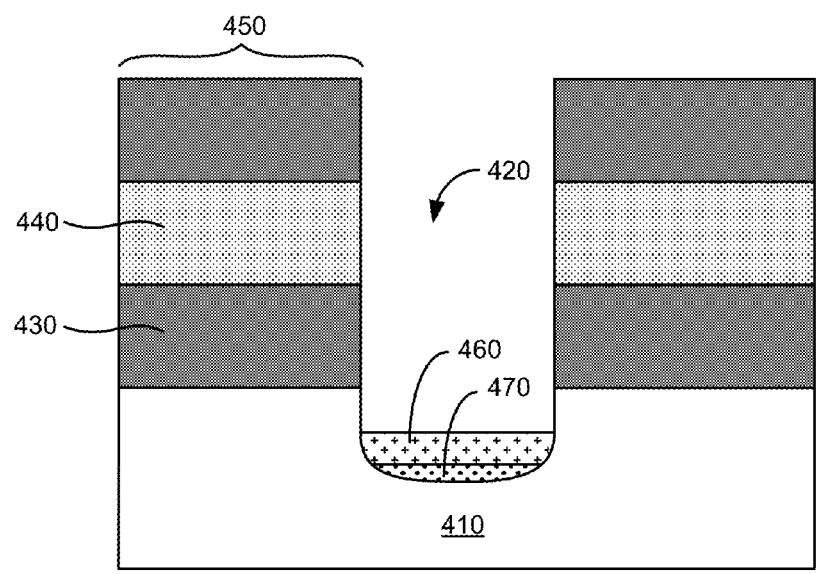
FIG. 4B shows a magnified view of the cross-sectional schematic in FIG. 4A illustrating an oxide layer over a silicon layer in one of the high-aspect ratio openings.

FIG. 4B shows a magnified view of the cross-sectional schematic in FIG. 4A illustrating an oxide layer over a damaged/amorphous silicon layer in one of the high-aspect ratio openings. When the high-aspect ratio openings 420 are formed between the vertical structures 450, an oxide layer 460 may form over a damaged/amorphous silicon layer 470. In some implementations, the oxide layer 460 can include silicon oxide. The oxide layer 460 may form over a damaged/amorphous silicon layer 470 that interfaces with the silicon substrate 410 at the bottom of the high-aspect ratio openings. The oxide layer 460 and the damaged/amorphous silicon layer 470 can increase the contact resistance of the device structure 400 if not removed, which can adversely affect the performance of a memory device. Other contaminants (not shown) may also be present at the bottom of the high-aspect ratio openings 420.

Removal of Oxide and Damaged/Amorphous Silicon

Disclosed herein is a process for cleaning contacts associated with high-aspect ratio structures, such as those used in memory devices, and more specifically 3D V-NAND memory devices. High-aspect ratio structures can include those structures having a height to lateral dimension aspect ratio of 10:1 or greater, or 40:1 or greater. In a memory device, the high-aspect ratio openings, such as holes or trenches, can be surrounded by alternating ONON (oxide/nitride) layers or alternating OPOP (oxide/polysilicon) layers, as illustrated in FIGS. 4A and 4B. The bottom of the contact can include undesired layers of silicon oxide, damaged/amorphous silicon, and other contaminants (e.g., carbon).

The present disclosure includes a method of removing contaminants while minimizing damage to the surrounding ONON or OPOP layers. The method of cleaning such contaminants can involve a two-step approach, where the first step includes removal of silicon oxide and the second step includes removal of damaged/amorphous silicon. In some implementations, the second step can further recess into the substrate to ensure removal of contaminants in the vicinity of the substrate. For the removal of silicon oxide in the first step, the chemistry can include active species of a fluorine-based gas and the operating conditions can include application of bias power. In some implementations, the chemistry can include active species of a hydrogen-based gas if the oxide removal includes native silicon oxide removal. In some implementations, the operating conditions can include a chamber pressure of about or less than about 10 mTorr. In some implementations, the fluorine-based gas is $NF_3$ and the operating conditions include application of bias power only for generation of $NF_3$ plasma, meaning that no source power is applied. Thus, the first step can be an oxide breakthrough step that is highly directional.

For the removal of damaged/amorphous silicon in the second step, the chemistry can include active species of a hydrogen-based gas and the operating conditions can include application of both bias power and source power. In some implementations, the chemistry includes $H_2$ or a mixture of $H_2$ and $NF_3$. Each step applies a different chemistry and different operating conditions for plasma generation to remove contaminants while minimizing damage to surrounding ONON or OPOP layers. Therefore, the second step can be a silicon removal step that is selective over surrounding oxide and nitride or polysilicon layers.

Figure 5:
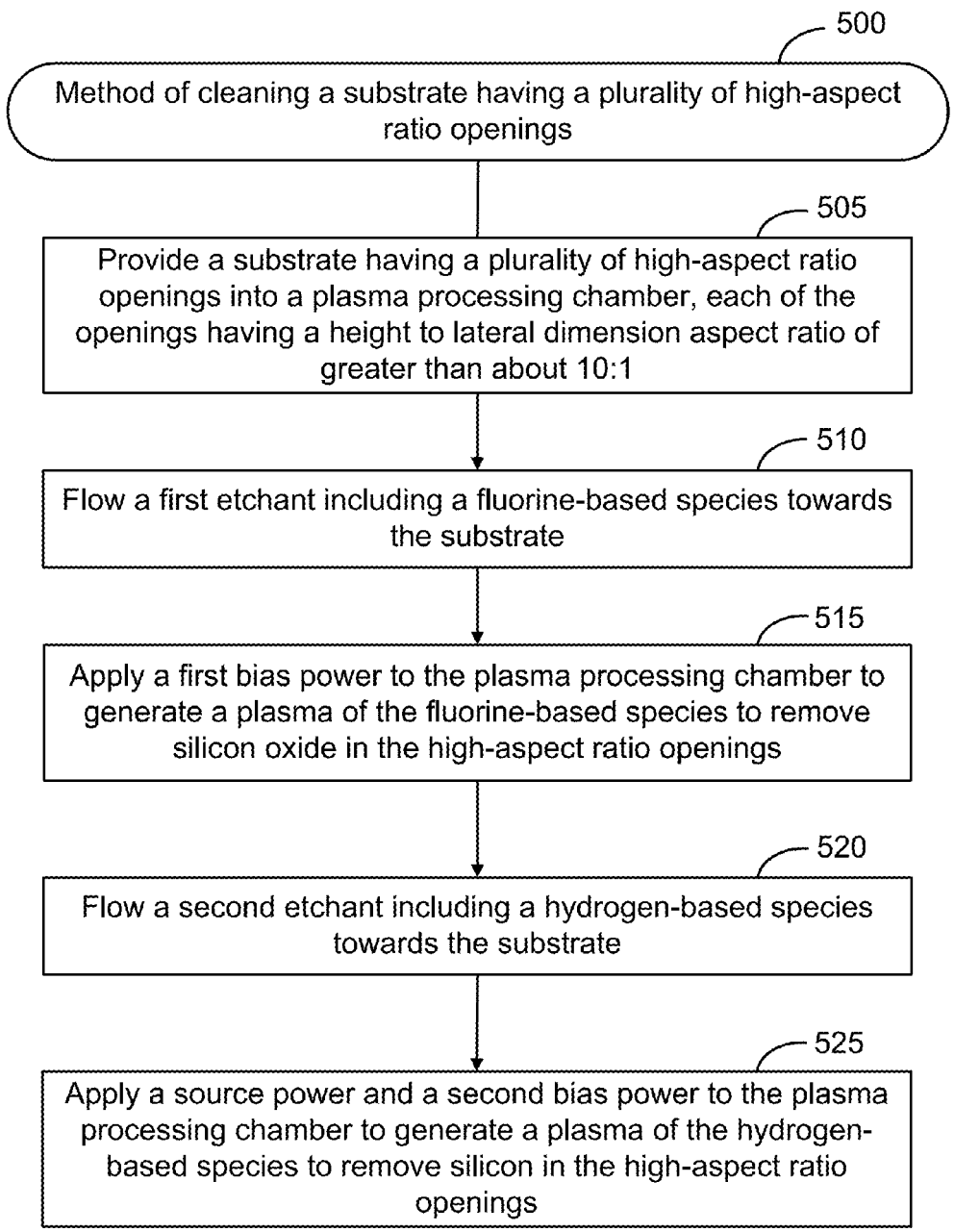
FIG. 5 shows an exemplary flow diagram of a method of cleaning a substrate having a plurality of high-aspect ratio openings.

FIG. 5 shows an exemplary flow diagram of a method of cleaning a substrate having a plurality of high-aspect ratio openings. A process 500 can begin at block 505 where a substrate is provided having a plurality of high-aspect ratio openings into a plasma processing chamber. For example, a substrate may be provided onto a pedestal in a plasma processing chamber as described in FIG. 1. Each of the openings can have a certain height or depth as well as a certain diameter or width. The openings can have a height to lateral dimension aspect ratio of greater than about 10:1, such as greater than about 40:1. The substrate can include any semiconductor wafer, partially integrated circuit, printed circuit board, or other appropriate work piece. In some implementations, the semiconductor wafer can be part of a memory device. The plasma processing chamber can include a substrate support for supporting the substrate and a showerhead for delivery of gases into the plasma processing chamber above the substrate support. The plasma processing chamber can be equipped for generating plasma using one or both of a source power and a bias power. In some implementations, the source power can generate an inductively coupled plasma in a remote downstream plasma device, such as a remote downstream plasma device illustrated in FIG. 2. In some implementations, the bias power can generate a capacitively coupled plasma between a showerhead and a pedestal, which can be illustrated in FIG. 1.

The substrate can be a silicon substrate having a plurality of vertical structures formed thereon, where the plurality of vertical structures define each of the high-aspect ratio openings. In other words, each of the openings can be surrounded by the vertical structures. Each of the vertical structures can include alternating layers of oxide and nitride or alternating layers of oxide and polysilicon. For example, the vertical structures can include alternating layers of silicon oxide and silicon nitride. In some implementations, the sidewalls of the high-aspect ratio openings can include the alternating layers of oxide and nitride, and the bottom surface of the high-aspect ratio opening can include sub-layers of contaminants over a silicon surface. The sub-layers of contaminants can include silicon oxide and damaged/amorphous silicon.

The process 500 continues at block 510 where a first etchant including a fluorine-based species is flowed towards the substrate. In some implementations, the first etchant consists only of $NF_3$. Alternatively, where the removal of oxide includes the removal of native silicon oxide, a first etchant includes a hydrogen-based species and is flowed towards the substrate. In such instances, the first etchant can consist only of $H_2$.

The process continues at block 515 where a first bias power is applied to the plasma processing chamber to generate a plasma of the fluorine-based species to remove silicon oxide in the high-aspect ratio openings. In implementations where the silicon oxide being removed is native silicon oxide, the first bias power may be applied to generate a plasma of the hydrogen-base species. In some implementations, the first bias power is applied to a substrate support in the plasma processing chamber. The first bias power may be applied simultaneously with flowing a fluorine-based species or hydrogen-based species in the gas phase towards the plasma processing chamber via the showerhead. An RF power supply and matching network may be in electrical communication with the plasma processing chamber. In some implementations, the RF power supply and matching network may be in electrical communication with the showerhead and the substrate support. The RF power supply and the matching network may provide RF power at any suitable RF frequency. Accordingly, an in-situ plasma of the fluorine-based species or hydrogen-based species may be generated between the showerhead and the substrate support, where the substrate support can be powered as an electrode. The bias power may be controlled to increase or decrease the ion bombardment with respect to generated in-situ plasma. In some implementations, the first bias power can be between about 100 W and about 2000 W, or between about 100 W and about 500 W.

The first bias power can generate ions of the fluorine-based species to etch the silicon oxide. The first bias power can provide directionality to the plasma so that an anisotropic etch can be achieved. Application of the first bias power can reduce the effect of ion scattering and direct ions of the fluorine-based species towards the bottom of the high-aspect ratio openings. While flowing the first etchant towards the substrate, the first bias power can be applied without any source power. For example, no source power is applied to the remote downstream plasma device so as to minimize the scattering of ions. The first etchant can be directed towards the substrate in a highly directional manner so as to avoid or otherwise minimize recessing the sidewalls of the vertical structures.

The first bias power can generate a plasma to cause the dissociation of $NF_3$ to form fluorine ions. The $NF_3$ plasma can etch the silicon oxide at a relatively high etch rate. In addition, the $NF_3$ plasma can avoid salt formation and polymerizing chemistry. Because the $NF_3$ plasma can be highly directional with the first bias power, the $NF_3$ plasma can avoid or otherwise minimize attacking the sidewalls of the vertical structures that contain oxide. Alternatively, the first bias power can generate a plasma to cause the dissociation of $H_2$ to form hydrogen radicals, where the $H_2$ plasma can etch native silicon oxides.

In some implementations, a pressure in the plasma processing chamber can be less than about 10 mTorr while flowing the first etchant towards the substrate and applying the first bias power to the plasma processing chamber. In some implementations, the pressure can be less than about 5 mTorr, or between about 1 mTorr and about 5 mTorr. By reducing the pressure inside the plasma processing chamber during removal of the silicon oxide, the effect of ion scattering can be reduced and the directionality of the $NF_3$ plasma can be increased. Therefore, application of bias power only in the plasma processing chamber along with a low pressure environment imparts more directionality to the reactants of the $NF_3$ plasma and increases the probability of them reaching the bottom of the high-aspect ratio openings with minimal lateral scatter toward the sidewalls of the vertical structures. As a result, silicon oxide can be cleared at the bottom of the high-aspect ratio openings with minimal damage to the vertical structures.

The process 500 continues at block 520 where a second etchant including a hydrogen-based species is flowed towards the substrate. In some implementations, the second etchant consists only of $H_2$. In other implementations, the second etchant includes $H_2$ and $NF_3$.

The process continues at block 525 where a source power and a second bias power are applied to the plasma processing chamber to generate a plasma of the hydrogen-based species to remove silicon in the high-aspect ratio openings. In some implementations, the source power may be applied to a remote plasma source and the second bias power may be applied to a substrate support. The source power and the second bias power may be applied simultaneously with flowing the hydrogen-based species in the gas phase towards the plasma processing chamber via the showerhead. After flowing the first etchant to remove silicon oxide in the high-aspect ratio openings, the conditions of the plasma processing chamber can change to perform the second step of removing silicon in the high-aspect ratio openings. A power source can energize induction coils to generate a plasma in a remote plasma source, such as a remote downstream plasma device. Accordingly, a remote plasma of the hydrogen-based species may be generated in the remote plasma source, where the remote plasma can include radicals of the hydrogen-based species. Furthermore, a second bias power may be applied to the plasma processing chamber in addition to the source power. The second bias power may be different than the first bias power. The second bias power may impart directionality to reactants of the hydrogen-based species and increase ion bombardment. In some implementations, a ratio between the source power and the second bias power can be controlled to balance the forces of ion bombardment from the second bias power and radical chemical etching from the source power. In some implementations, the source power can be between about 100 W and about 2000 W or between about 500 W and about 1500 W, and the second bias power can be between about 50 W and about 1000 W or between about 200 W and about 800 W. In terms of a ratio between the source power and the second bias power, the ratio can be about equal to or greater than about 4:1, about equal to or greater than about 2:1, or about equal to or greater than about 1:1. The ratio may be an important parameter for controlling a directionality of the etch profile, as it can control the balance between ion bombardment and the radical-driven chemical etch of silicon.

The silicon that is removed may include damaged/amorphous silicon. In some implementations, some silicon from the silicon substrate is also removed at the bottom of the high-aspect ratio openings in order to ensure a more complete removal of surrounding contaminants in the vicinity of the silicon substrate. The chemistry of the second etchant can remove silicon while avoiding or minimizing recessing into the oxide and nitride/polysilicon layers based on its selectivity over oxide and nitride/polysilicon.

The source power may be applied to a remote plasma source in the plasma processing chamber, where flowing the second etchant can include exposing the hydrogen-based species to the remote plasma source to generate radicals of the hydrogen-based species. The radicals can be used to etch silicon at the bottom of the high-aspect ratio openings. The second bias power may be applied to the plasma processing chamber to generate ions of the hydrogen-based species to further etch silicon at the bottom of the high-aspect ratio openings. Because the source power can provide a radical-driven etch that is not very directional, applying a bias power with the source power can provide a more directional etch profile when removing silicon at the bottom of the high-aspect ratio openings. Thus, the second etchant in block 525 can recess into the substrate with a directional etch profile, and the recess amount can be carefully tuned and controlled.

In some implementations, the second etchant consists only of $H_2$. Using a hydrogen-based species such as $H_2$ can effectively etch silicon while acting as a reducing agent that minimizes oxidation and loss of other exposed materials. In the present disclosure, $H_2$ plasma may react with the silicon in an environment substantially free of an oxidizing agent (e.g., oxygen). The etch rate of silicon using $H_2$ plasma can be relatively good and the selectivity over exposed nitride and oxide layers can be extremely high. For example, the etch rate of silicon using $H_2$ plasma assisted with bias power can be greater than about 150 Å per minute or greater than about 500 Å per minute, and the etch rates of the exposed nitride and/or oxide layers can be negligible, such as less than about 5 Å per minute or less than about 1 Å per minute. By applying source power, a remote plasma including hydrogen radicals may be generated to react with the silicon. Bias power application may also provide ion-assisted chemical etch, which can give rise to etch directionality at the contact bottom. Although the presence of the hydrogen-based radicals may give some aspect of isotropic etch, the pure $H_2$ plasma is highly selective over exposed oxide and nitride layers in the vertical structures. Thus, damage to the ONON sidewalls can be avoided. Additionally, the pure $H_2$ plasma does not react to generate a salt byproduct, as salt byproducts can lead to uniformity issues and substrate-to-substrate repeatability issues. The conventional operating conditions and chemistries of previous plasma-based approaches for removal of oxide and/or silicon tend to generate byproducts, which compromise device performance.

In other implementations, the second etchant includes $H_2$ and $NF_3$. The concentration of $H_2$ may be greater than the concentration of $NF_3$. The addition of a fluorine-based species such as $NF_3$ can change the etch behavior of silicon. The addition of $NF_3$ can increase the etch rate of silicon. This can be advantageous so as to provide increased efficiency and throughput during processing. However, the $NF_3$ may not be as selective over exposed oxide and nitride/polysilicon layers. Furthermore, the addition of $NF_3$ may not provide as smooth or as directional of an etch profile when compared to using an etchant consisting only of $H_2$. In some implementations, the concentration of the fluorine-based species in a $H_2/NF_3$ plasma can be between about 0.1% and about 10% per volume, or between about 0.5% and about 5% per volume. In turn, the concentration of the hydrogen-based species can be greater than about 90% per volume or greater than about 95% per volume. In other implementations, the concentration of the fluorine-based species can be zero so that the remote plasma is pure $H_2$ plasma. The selectivity of pure $H_2$ plasma for silicon over oxide can be greater than about 1000:1 or greater than about 10000:1, and the selectivity of pure $H_2$ plasma for silicon over nitride can be greater than about 500:1 or greater than about 1000:1. The pure $H_2$ plasma may provide a more directional and smoother etch profile than the $H_2/NF_3$ plasma.

The conditions of the plasma processing chamber can be configured to optimize removal of the silicon at the bottom of the high-aspect ratio openings while minimizing the loss of surrounding oxide and nitride layers in the vertical structures of the substrate. In some implementations, the pressure in the plasma processing chamber can be between about 10 mTorr and about 3500 mTorr, or between about 200 mTorr and about 1500 mTorr. In some implementations, the temperature of the substrate can affect the etch rate and the etch profile for the removal of silicon. In some implementations, the temperature can be between about 5° C. and about 200° C., or between about 20° C. and about 100° C.

An example of operating conditions for the removal of silicon oxide and for the removal of silicon can be shown in Table 1. For the removal of silicon oxide, the chemistry can include a $NF_3$ plasma. Alternatively, if the removal includes the removal of native silicon oxide, the chemistry can include a $H_2$ plasma. For the removal of silicon, the chemistry can either include pure $H_2$ plasma or a $H_2/NF_3$ plasma. The plasmas may be generated sequentially so that the process 500 of removing silicon oxide and removing silicon can be performed sequentially. The $NF_3$ plasma step can be performed with high directionality and the $H_2$ plasma step can be performed with high selectivity. Each of the plasma chemistries does not react to form undesirable salt byproducts. In some implementations, the steps of removing silicon oxide and of removing silicon can be performed in a single standalone processing apparatus including the plasma processing chamber, an example of which is shown in FIG. 1 or FIG. 2. In some implementations, the steps of removing silicon oxide and of removing silicon can be performed in separate stations in a multi-station processing apparatus, an example of which is shown in FIG. 3.

TABLE 1

| Step | Chemistry | % NF$_3$ by volume | Source Power (W) | Bias Power (W) | Pressure (mTorr) | Temperature (° C.) | Total Flow (sccm) |
|---|---|---|---|---|---|---|---|
| Removal of silicon oxide | Pure NF$_3$ | 100% | 0 | <500 | 5-10 | ≤20 mTorr | <200 |
| Removal of silicon | Pure H$_2$ | 0% | 500-1500 | 200-800 | 200-1500 | 20-100 | 1000-5000 |
| Removal of silicon | H$_2$/NF$_3$ | 0.5-10% | 500-1500 | 200-800 | 200-1500 | 20-100 | 1000-5000 |

In some implementations, an inert carrier gas can be used with one or both of the steps in removal of silicon oxide and silicon. It is believed that an inert gas carrier may reduce the likelihood of recombination of radicals in the gas phase. Examples of inert gas carriers can include noble gases, such as helium (He), neon (Ne), and argon (Ar).

High-aspect ratio contacts can be cleaned using the process 500 as described above by etching silicon oxide and silicon at the bottom of the high-aspect ratio openings. The process 500 may be generally referred to as a contact-clean process. In fact, the process 500 can be used in any cleaning process for removing silicon oxide and silicon, especially in devices having high-aspect ratio features. In some implementations, the plurality of high-aspect ratio openings are part of a vertical NAND structure. In some implementations, the high-aspect ratio openings can be filled with a metal or other electrically conductive material. The metal can form electrical contacts between the vertical structures on the silicon substrate, where the metal contacts the silicon substrate. Using the contact-clean process as described above, the electrical contacts can have improved electrical properties in the device with the removal of electrically insulative contaminants, with the minimization of laterally recessed sidewalls, and with the minimization of forming residual salt byproducts.

The process 500 for removing silicon oxide and silicon for cleaning in high-aspect ratio openings can be performed with reference to FIGS. 1-3. In some implementations, any of the controllers in FIGS. 1-3 may be configured with instructions for performing the operations in the process 500. The controllers may provide instructions for operating conditions in the plasma processing chamber for performing the operations in the process 500. For example, an apparatus for cleaning a substrate having a plurality of high-aspect ratio openings can include a plasma processing chamber, where the plasma processing chamber includes a remote plasma source and a substrate support for supporting a substrate. The substrate can have a plurality of high-aspect ratio openings where each of the openings have a height to lateral dimension aspect ratio of greater than about 10:1 or greater than about 40:1. The substrate can be contaminated with a silicon oxide layer over a silicon layer at the bottom of the high-aspect ratio openings and over the surface of the substrate. The apparatus can further include a controller configured to provide instructions for performing the following operations: (a) flowing a first etchant including a fluorine-based species towards the substrate; (b) applying a first bias power to the substrate support in the plasma processing chamber to generate a plasma of the fluorine-based species to remove the silicon oxide layer; (c) flowing a second etchant including a hydrogen-based species towards the substrate; and (d) applying a source power to the remote plasma source and a second bias power to the substrate support in the plasma processing chamber to generate a plasma of the hydrogen-based species to remove the silicon layer. In some implementations, the first etchant may include only NF$_3$. Alternatively, where the removal of silicon oxide includes the removal of native silicon oxide, the first etchant can include a hydrogen-based species, such as H$_2$. In some implementations, the second etchant may include only H$_2$. In some implementations, the second etchant may include only H$_2$ and NF$_3$, where the concentration of H$_2$ is greater than the concentration of NF$_3$. In some implementations, the substrate includes a plurality of vertical structures defining each of the high-aspect ratio openings, each of the vertical structures including alternating layers of oxide and nitride or alternating layers of oxide and polysilicon.

Data

Figure 6A:
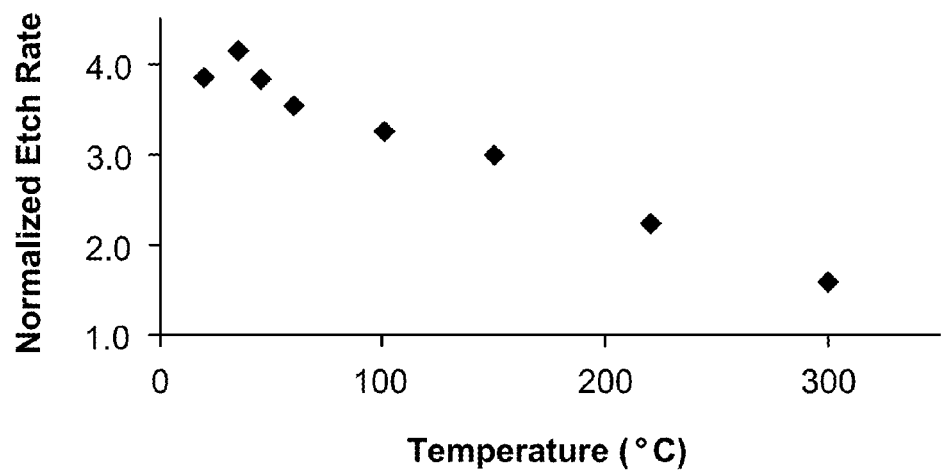
FIGS. 6A-6C show graphs illustrating polysilicon etch rates for pure $H_2$ plasma as a function of temperature, pressure, and source power.
Figure 6B:
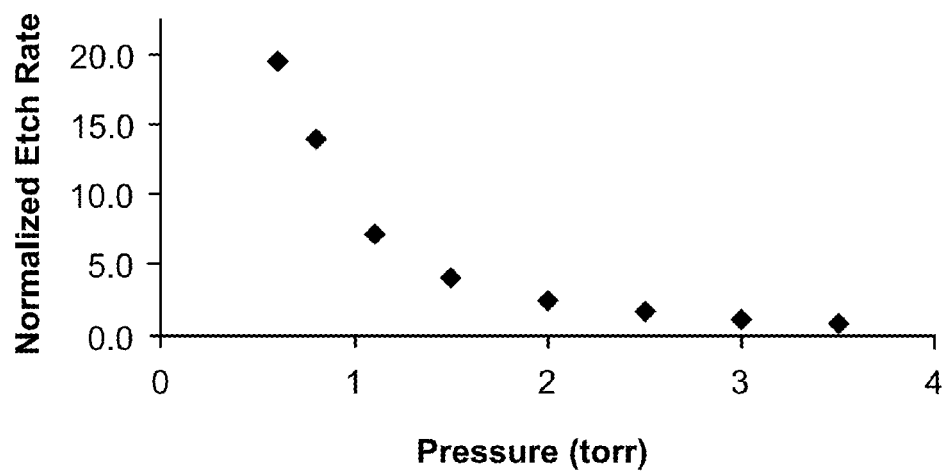
Figure 6C:
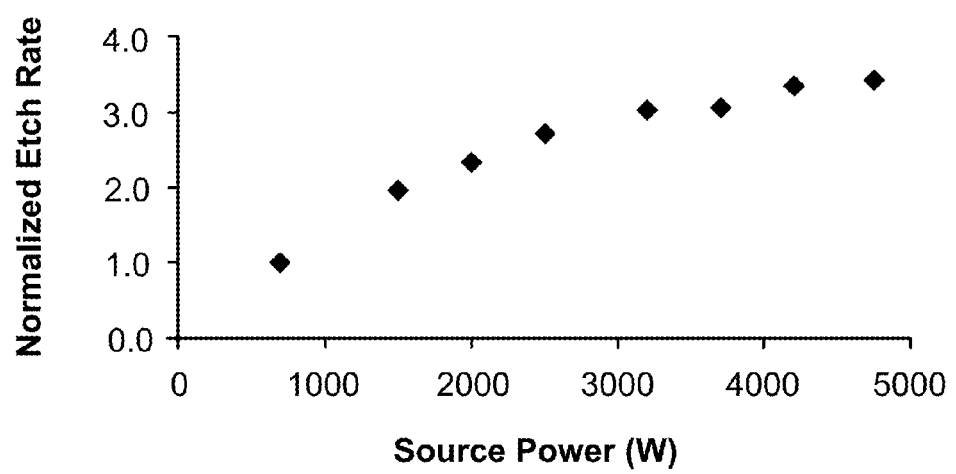

When removing silicon, the etch rate for the removal of silicon can be dependent on one or more operating parameters. FIGS. 6A-6C show graphs illustrating polysilicon etch rates for pure H$_2$ plasma with application of source power only as a function of temperature, pressure, and source power. FIG. 6A shows the relationship between temperature and the polysilicon etch rate for pure H$_2$ plasma. At temperatures of less than about 40° C., the etch rate of polysilicon increases with increasing temperature. At temperatures greater than about 40° C., the etch rate of polysilicon decreases with increasing temperature. As such, the maximum etch rate of polysilicon can exhibit a temperature maximum (T$_{max}$), such as T$_{max}$~40° C. Below T$_{max}$, increasing the temperature increases the thermal activation for the volatile silane (SiH$_4$) formation, thereby increasing the polysilicon etch rate. Above the T$_{max}$, there can be recombination of hydrogen atoms on the polysilicon surface that consumes the chemisorbed hydrogen atoms needed for the formation of volatile SiH$_4$.

FIG. 6B shows the polysilicon etch rate as a function of pressure for pure H$_2$ plasma. As pressure increases, the etch rate of polysilicon decreases steadily. However, it is possible that when the pressure goes below 600 mTorr, a maximum in etch rate as a function of pressure can be observed. At pressures greater than about 600 mTorr and less than about 3500 mTorr, the etch rate of polysilicon decreases. When pressure increases, the physisorption of hydrogen atoms on the polysilicon surface is expected to increase. The rate of surface recombination of physisorbed hydrogen atoms and chemisorbed hydrogen atoms can increase to form H$_2$ gas, resulting in the depletion of SiH$_x$ precursors. In addition, the rates of surface (wall) and volume recombination of hydrogen atoms also increase with pressure, which could give rise to lower concentrations of hydrogen radicals that are available for reaction with the polysilicon surface.

FIG. 6C shows the polysilicon etch rate as a function of source power for pure H$_2$ plasma. The etch rate of polysilicon increases with increasing RF power for pure H$_2$ plasma. For a single 300 mm wafer, the etch rate of polysilicon approximately plateaus at a certain power, which can be about 3000 W for a Lam Research Corporation Gamma GxT tool. Beyond this maximum power, the recombination of hydrogen atoms may be substantial enough so that the etch rate of polysilicon does not appreciably change.

Figure 7A:
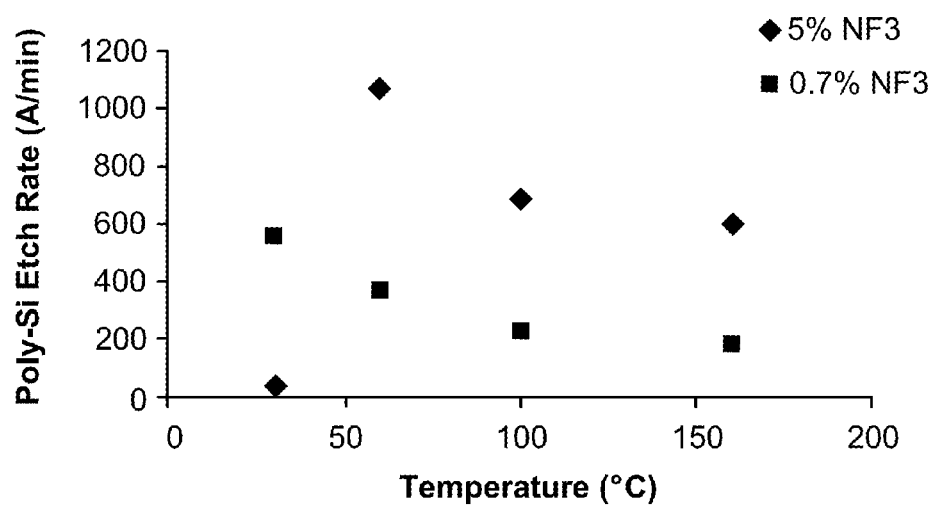
FIGS. 7A-7B show graphs illustrating polysilicon etch rates for $H_2/NF_3$ plasma as a function of temperature and pressure.
Figure 7B:
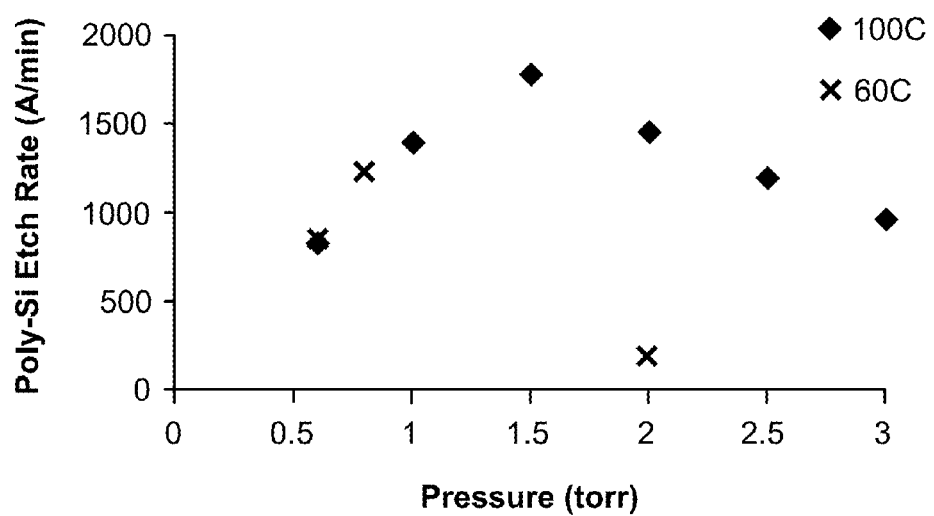

FIGS. 7A-7B show graphs illustrating polysilicon etch rates for $H_2/NF_3$ plasma using source power only as a function of temperature and pressure. For plasma with a gas mixture of $H_2$ and $NF_3$, the polysilicon etch rate exhibits a strong dependence on temperature. FIG. 7A shows the polysilicon etch rate as a function of temperature. For a gas mixture with a concentration of about 5% $NF_3$, the etch rate of polysilicon increases to a maximum at $T_{max}$ between about 60° C. and about 80° C. When the temperature is greater than about $T_{max}$, the etch rate of polysilicon decreases. For a gas mixture with a concentration of about 0.7% $NF_3$, when the temperature is greater than about 30° C., the etch rate of polysilicon decreases. In this case, $T_{max}$ can occur at a temperature that is less than about 30° C. Additionally, for temperatures greater than about 40° C., the etch rate of polysilicon is higher for 5% $NF_3$ than for 0.7% $NF_3$. Thus, an increase in the concentration of a fluorinated gas species can lead to a higher etch rate of polysilicon.

For plasma with a gas mixture of $H_2$ and $NF_3$, the polysilicon etch rate also exhibits a strong dependence on pressure. FIG. 7B shows the polysilicon etch rate as a function of pressure. When the temperature is fixed at about 100° C. for a gas mixture with about 5% $NF_3$, the etch rate of polysilicon increases with pressure between about 0.6 Torr and about 1.5 Torr. However, the etch rate of polysilicon decreases with pressure at pressures beyond about 1.5 Torr. When the temperature is fixed at about 60° C. for a gas mixture with about 5% $NF_3$, the etch rate of polysilicon also increases with pressure between about 0.6 Torr and about 0.8 Torr. At a high pressure of about 2 Torr, the etch rate is found to drop substantially. Thus, the maximum etch rate of polysilicon can be realized at a pressure of $P_{max}$ between about 1.0 Torr and about 1.5 Torr at about 5% $NF_3$ for both 60° C. and 100° C.

Figure 8:
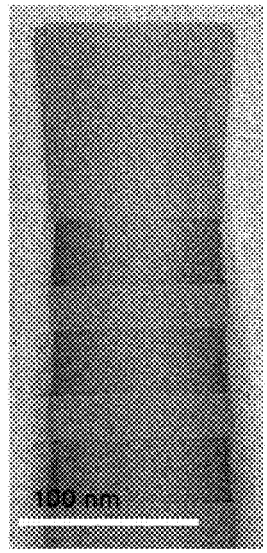
FIG. 8 shows a TEM image of a vertical structure having alternating layers of silicon oxide and silicon nitride.

FIG. 8 shows a TEM image of a vertical structure having alternating layers of silicon oxide and silicon nitride. The TEM image can correspond to a top portion of an ONON stack. The use of an HF wet etch may generate a wavy structure with respect to the ONON stack, and the use of a conventional less directional plasma etch (e.g., $NF_3$ plasma etch) may generate a tapered structure with respect to the ONON stack. However, using the aforementioned two-step approach with an $NF_3$ plasma etch with bias power only followed by an $H_2$ plasma etch with both source power and bias power, damage to the ONON stack may be minimized. The ONON stack remains largely unaffected pre-clean and post-clean, showing minimal or no sidewall damage.

Using TEM images such as the TEM image in FIG. 8, lateral loss of oxide and nitride layers can be calculated as a result of using the contact-clean process as described above. A TEM image can be taken before the contact-clean process and another TEM image can be taken after the contact-clean process. The oxide and nitride lateral losses can be characterized in an ONON stack using the top 4 pairs of the ONON stack and comparing them to the bottom 4 pairs of the ONON stack. Table 2 shows the characterization of lateral loss of oxide layers for the top layers and the bottom layers, and Table 3 shows the characterization of lateral loss of nitride layers for the top layers and the bottom layers.

TABLE 2

| Oxide Layer | Oxide Loss (nm) | |
| --- | --- | --- |
| | Top | Bottom |
| Oxide Layer 1 | 2.0 | 1.3 |
| Oxide Layer 2 | 2.1 | 2.1 |
| Oxide Layer 3 | 2.4 | 1.3 |
| Oxide Layer 4 | 1.2 | 1.2 |
| Average Loss | 1.9 | 1.5 |

TABLE 3

| Nitride Layer | Nitride Loss (nm) | |
| --- | --- | --- |
| | Top | Bottom |
| Nitride Layer 1 | 2.2 | 2.5 |
| Nitride Layer 2 | 0.7 | 3.4 |
| Nitride Layer 3 | −0.8 | 2.0 |
| Nitride Layer 4 | 0.9 | 2.6 |
| Average Loss | 0.8 | 2.6 |

The average oxide loss calculated for the top four oxide layers is 1.9 nm, while that for the bottom four oxide layers is 1.5 nm. The difference of 0.4 nm in oxide loss between the top and bottom layers of the high-aspect ratio structure is about less than 1% of the original width of the oxide layer. The original width of the oxide layer can be about 100 nm.

Similarly, the average nitride loss calculated for the top four nitride layers is 0.8 nm, while that for the bottom four nitride layers is 2.6 nm. The difference of 1.8 nm between the top and bottom layers of the high-aspect ratio structure is less than 2% of the original width of the nitride layer. The original width of the nitride layer can be about 100 nm.

The data gathered and calculated in Tables 2 and 3 shows that there is minimal loss of nitride and oxide. Moreover, the data reveals that there is little difference in material loss between the top and the bottom of the high-aspect ratio structures, which implies that little to no waviness has resulted from the contact-clean process. Therefore, additional processing may not be necessary to correct any waviness in the high-aspect ratio structures.

Figure 9A:
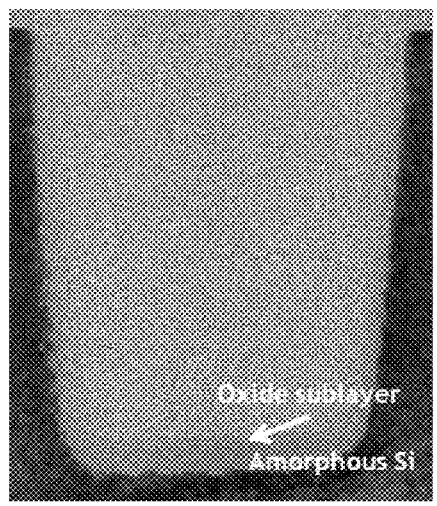
FIG. 9A shows a TEM image of a high-aspect ratio opening with an oxide layer over a silicon layer.
Figure 9B:
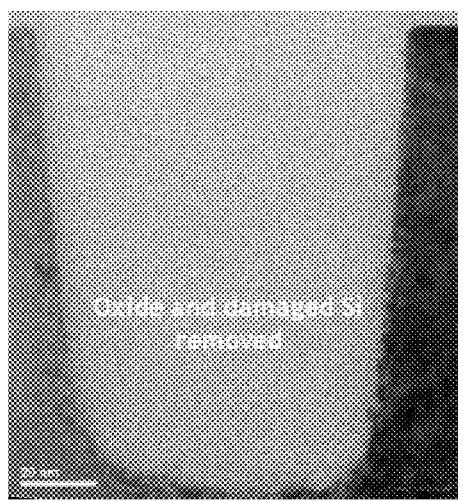
FIG. 9B shows a TEM image of the high-aspect ratio opening with the oxide layer and the silicon layer removed.

FIG. 9A shows a TEM image of a high-aspect ratio opening with an oxide layer over an amorphous silicon layer. FIG. 9B shows a TEM image of the high-aspect ratio opening with the oxide layer and the amorphous silicon layer removed. The aforementioned contact-clean process can successfully remove the oxide layer and the amorphous silicon layer over a silicon substrate. The oxide layer and the amorphous silicon layer can be removed with a directional etch profile. An analysis of the TEM image indicates that the contact interface is relatively clean. The interface is devoid of oxygen and other contaminants. Furthermore, the silicon substrate that interfaces with a contact post process corresponds to pristine single crystal silicon. In some implementations, the contact-clean process recesses into the silicon substrate to ensure that all contaminants in the vicinity of the silicon substrate are completely removed.

Figure 10A:
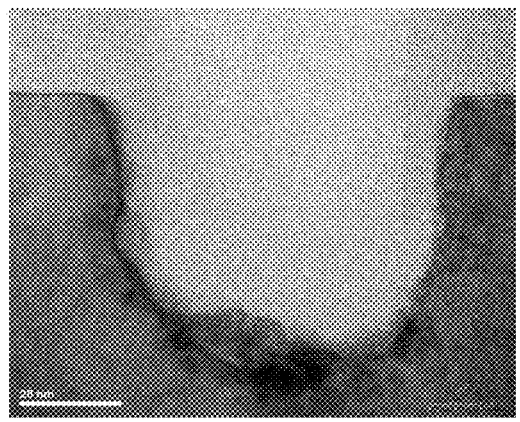
FIGS. 10A-10C show TEM images of high-aspect ratio openings with different etch profiles for varying source:bias power ratios during the silicon layer removal.
Figure 10B:
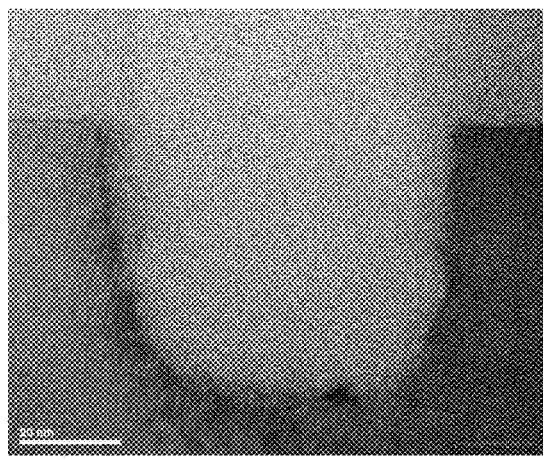
Figure 10C:
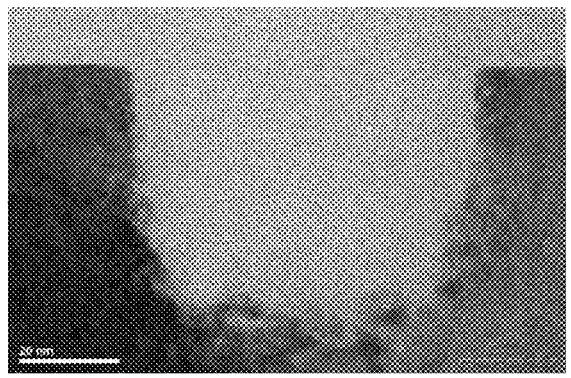

FIGS. 10A-10C show TEM images of high-aspect ratio openings with different etch profiles for varying source:bias power ratios during the silicon layer removal. Following the step for the removal of silicon oxide, a source power and a bias power can be used to generate a plasma for a hydrogen-based species such as $H_2$, where the $H_2$plasma can remove silicon. The ratio between the source power and the bias power can affect the etch profile of the silicon removal. The ratio can be varied by fixing the source power and varying the bias power. In some implementations, the source power can be fixed at 1000 W in FIGS. 10A-10C and the bias power can be 250 W in FIG. 10A, 500 W in FIG. 10B, and 700 W in FIG. 10C. In FIG. 10A, a reduced bias power can be applied so that the ratio between the source power and the bias power can be greater than 2:1. The source power can create a more isotropic etch, resulting in a non-directional etch profile. In FIG. 10B, a bias power and a source power can be balanced so that the ratio can be about 2:1. The resulting etch profile can be optimized so that the etch profile is directional and limited in surface roughness. In FIG. 10C, a bias power can be increased so that the ratio between the source power and the bias power can be less than 2:1. The resulting etch profile can be erratic and uneven with a greater degree of surface roughness due at least in part to increased ion bombardment.

Figure 11:
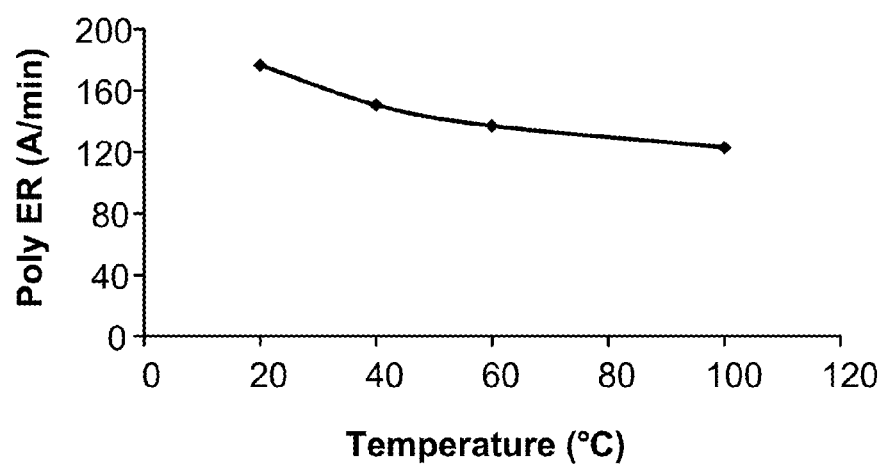
FIG. 11 shows a graph illustrating polysilicon etch rates as a function of temperature when both source and bias powers are used.

FIG. 11 shows a graph illustrating a polysilicon etch rate as a function of temperature. The data points show that pure $H_2$ plasma with the addition of bias power can etch polysilicon at a relatively high etch rate. The etch rate is dependent on temperature of the substrate, where the etch rate decreases with temperature. Thus, the temperature of the substrate support can be varied to control the amount of silicon removal and recess. In the graph in FIG. 11, operating conditions for the polysilicon etch include: 2.5 slm $H_2$, 1000 W source power, 500 W bias power, 400 mTorr, and 60 seconds of processing.

Figure 12A:
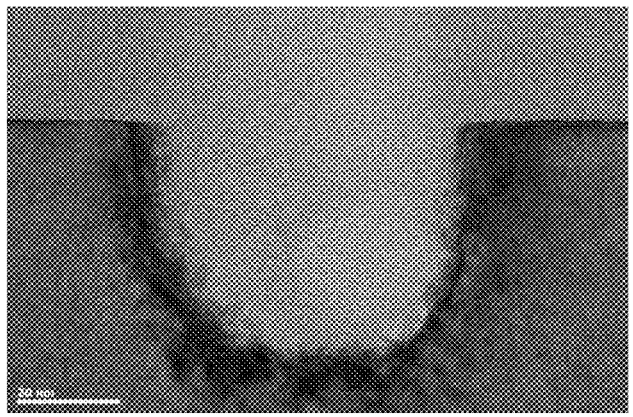
FIGS. 12A-12B show TEM images of a high-aspect ratio opening with different etch profiles for varying temperatures during the silicon layer removal.
Figure 12B:
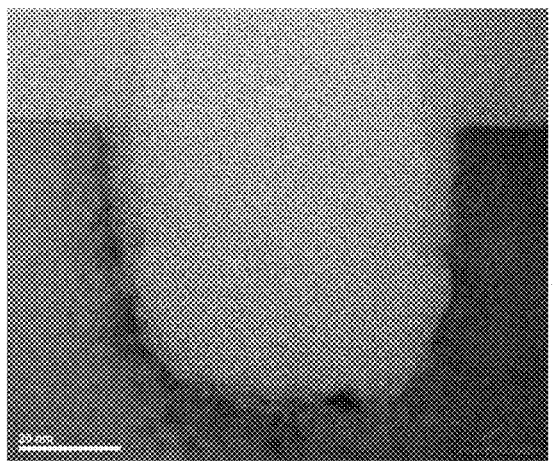

FIGS. 12A-12B show TEM images of a high-aspect ratio opening with different etch profiles for varying temperatures during the silicon layer removal. The TEM images show that the etch profile for the silicon removal and the recess amount into the silicon substrate can depend on temperature. As the temperature of the substrate decreases for the silicon removal and recess step, the etch profile can become smoother. Furthermore, the vertical etch rate of the silicon substrate can increase with decreasing temperature. FIG. 12A shows an etch profile with some surface roughness on the etch front for a higher temperature. FIG. 12B shows an etch profile with a smoother etch front and increased silicon loss in the vertical direction obtained using a lower temperature.

Photolithography

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Other Embodiments

Although the foregoing disclosed techniques, operations, processes, methods, systems, apparatuses, tools, films, chemistries, and compositions have been described in detail within the context of specific embodiments for the purpose of promoting clarity and understanding, it will be apparent to one of ordinary skill in the art that there are many alternative ways of implementing foregoing embodiments which are within the spirit and scope of this disclosure. Accordingly, the embodiments described herein are to be viewed as illustrative of the disclosed inventive concepts rather than restrictively, and are not to be used as an impermissible basis for unduly limiting the scope of any claims eventually directed to the subject matter of this disclosure.

What is claimed is:

1. A method of cleaning a substrate having a plurality of high-aspect ratio openings, the method comprising:
   providing a substrate having a plurality of high-aspect ratio openings into a plasma processing chamber, each of the openings having a height to lateral dimension aspect ratio of greater than about 10:1;
   flowing a first etchant including a fluorine-based species towards the substrate;
   applying a first bias power to the plasma processing chamber to generate a plasma of the fluorine-based species to remove silicon oxide in the high-aspect ratio openings;
   flowing a second etchant including a hydrogen-based species towards the substrate, wherein the second etchant consists only of hydrogen or includes hydrogen and nitrogen trifluoride, a concentration of the hydrogen being greater than a concentration of the nitrogen trifluoride; and
   applying a source power and a second bias power to the plasma processing chamber to generate a plasma of the hydrogen-based species to remove silicon in the high-aspect ratio openings.

2. The method of claim 1, wherein the first etchant consists only of nitrogen trifluoride.

3. The method of claim 1, wherein the removal of the silicon oxide occurs without any source power being applied in the plasma processing chamber.

4. The method of claim 1, wherein the substrate includes a plurality of vertical structures defining each of the high-aspect ratio openings, each of the vertical structures including alternating layers of oxide and nitride.

5. The method of claim 4, wherein the alternating layers of oxide and nitride include alternating layers of silicon oxide and silicon nitride.

6. The method of claim 4, wherein removal of the silicon in the high aspect ratio openings occurs at a selectivity greater than about 500:1 over each of the alternating layers of oxide and nitride.

7. The method of claim 1, wherein a pressure in the plasma processing chamber is less than about 10 mTorr while flowing the first etchant towards the substrate and applying the first bias power.

8. The method of claim 1, wherein a ratio between the source power and the second bias power to remove the silicon is about equal to or greater than about 2:1.

9. The method of claim 1, wherein the silicon includes amorphous or damaged silicon.

10. The method of claim 1, wherein the source power is applied to a remote plasma source in the plasma processing chamber, and wherein applying the source power includes exposing the hydrogen-based species to the remote plasma source to generate radicals of the hydrogen-based species.

11. The method of claim 1, wherein applying the first bias power includes exposing the fluorine-based species to the first bias power to generate ions of the fluorine-based species, wherein the ions of the fluorine-based species remove the silicon oxide in a directional etch profile.

12. The method of claim 1, wherein the plurality of high-aspect ratio openings are part of a vertical NAND structure.

13. A method of cleaning a substrate having a plurality of high-aspect ratio openings, the method comprising:
providing a substrate having a plurality of high-aspect ratio openings into a plasma processing chamber, each of the openings having a height to lateral dimension aspect ratio of greater than about 10:1;
flowing a first etchant including a fluorine-based species or a hydrogen-based species towards the substrate;
applying a first bias power to the plasma processing chamber to generate a plasma of the first etchant to remove silicon oxide in the high-aspect ratio openings, wherein the removal of the silicon oxide occurs without any source power being applied in the plasma processing chamber;
flowing a second etchant including a hydrogen-based species towards the substrate; and
applying a source power and a second bias power to the plasma processing chamber to generate a plasma of the second etchant to remove silicon in the high-aspect ratio openings.

14. The method of claim 13, wherein the first etchant consists only of nitrogen trifluoride.

15. The method of claim 13, wherein the second etchant consists only of hydrogen or includes hydrogen and nitrogen trifluoride, a concentration of the hydrogen being greater than a concentration of the nitrogen trifluoride.

16. The method of claim 13, wherein the substrate includes a plurality of vertical structures defining each of the high-aspect ratio openings, each of the vertical structures including alternating layers of oxide and nitride.

17. The method of claim 16, wherein the alternating layers of oxide and nitride include alternating layers of silicon oxide and silicon nitride.

18. The method of claim 16, wherein removal of the silicon in the high aspect ratio openings occurs at a selectivity greater than about 500:1 over each of the alternating layers of oxide and nitride.

19. The method of claim 13, wherein a ratio between the source power and the second bias power to remove the silicon is about equal to or greater than about 2:1.

20. The method of claim 13, wherein a pressure in the plasma processing chamber is less than about 10 mTorr while flowing the first etchant towards the substrate and applying the first bias power.

* * * * *